United States Patent
Singer et al.

[11] Patent Number: 6,118,326
[45] Date of Patent: Sep. 12, 2000

[54] TWO-PHASE BOOTSTRAPPED CMOS SWITCH DRIVE TECHNIQUE AND CIRCUIT

[75] Inventors: Lawrence Singer, Bedford, Mass.; Todd L. Books, Irvine, Calif.

[73] Assignee: Analog Devices, Inc., Norwood, Mass.

[21] Appl. No.: 08/965,266

[22] Filed: Nov. 6, 1997

[51] Int. Cl.[7] .................................................. H03K 17/16
[52] U.S. Cl. .......................................................... 327/390
[58] Field of Search ........................ 326/88, 92; 327/390, 327/536

[56] References Cited

U.S. PATENT DOCUMENTS

| | | | |
|---|---|---|---|
| 4,527,047 | 7/1985 | Donaldson et al. | 307/246 |
| 4,734,599 | 3/1988 | Bohac, Jr. | 307/497 |
| 5,065,049 | 11/1991 | Jang | 307/443 |
| 5,084,634 | 1/1992 | Gorecki | 307/352 |
| 5,170,075 | 12/1992 | deWit | 307/353 |
| 5,172,019 | 12/1992 | Naylor et al. | 307/578 |
| 5,179,296 | 1/1993 | Ito | 307/296.2 |
| 5,216,290 | 6/1993 | Childers | 307/296.1 |
| 5,241,502 | 8/1993 | Lee et al. | 365/203 |
| 5,500,612 | 3/1996 | Sauer | 327/91 |
| 5,519,340 | 5/1996 | Rybicki et al. | 326/88 |
| 5,581,455 | 12/1996 | Rossi et al. | 363/60 |
| 5,594,380 | 1/1997 | Nam | 327/390 |
| 5,621,348 | 4/1997 | Furutani et al. | 327/589 |
| 5,640,118 | 6/1997 | Drouot | 327/306 |
| 5,689,208 | 11/1997 | Nadd | 327/390 |

OTHER PUBLICATIONS

Nonideal Effects in Switched–Capacitor Circuits from Analog MOS Integrated Circuits for Signal Processing, Gregorian et al., 1986, pp. 516–517 only.
A 10–bit, 20–MS/s, 35–mW Pipeline A/D Converter, Thomas B. Cho et al., IEEE 1994 Integrated Circuits Conference, pp. 499–502.

*Primary Examiner*—Jeffrey Zweizig
*Attorney, Agent, or Firm*—Wolf, Greenfield & Sacks, P.C.

[57] ABSTRACT

A circuit that produces a gate drive voltage for a MOS transistor switch, that receives an input voltage "on" a source terminal, includes a first input that receives the input voltage, a second input that receives a bias voltage, and a voltage storage element. A first switch connects the voltage storage element to sample one of the input voltage and the bias voltage during a first of first and second non-overlapping time intervals. A second switch connects the voltage storage element to increase the sampled voltage by another of the input voltage and the bias voltage to the gate drive voltage during the second non-overlapping time interval, while maintaining the gate drive voltage less than a breakdown voltage of the MOS transistor switch. A third switch connects the voltage storage element to provide the gate drive voltage to the MOS transistor switch such that a gate-to-source voltage of the MOS transistor switch is maintained approximately constant.

11 Claims, 8 Drawing Sheets

TWO-PHASE BOOTSTRAPPED CMOS SWITCH DRIVE TECHNIQUE AND CIRCUIT

FIELD OF THE INVENTION

The present invention relates to a method and circuit for controlling the voltage level of a gate drive signal of a Metal Oxide Semiconductor [MOS] Field Effect Transistor [FET] switch to optimize performance of the MOS FET switch in a discrete time analog circuit.

BACKGROUND OF THE INVENTION

MOS FETs universally are used in analog, discrete time signal processing circuits due to their nearly ideal switching characteristics. Applications include voltage sampling circuits such as discrete-to-continuous time interface circuits and switched-capacitor circuits, such as those used in analog-to-digital converters [ADCs]. In all of these sampling circuits, MOS switches are used to couple signals onto capacitive storage elements. These switches may be turned "on" and "off" by controlling the voltage on their gate electrodes. In order to turn the switches "on", the voltage between the gate and source electrodes (Vgs) must exceed the threshold voltage (Vt) of the transistor.

One common implementation of a MOS switch, a transmission gate, includes a PMOS and NMOS transistor connected in parallel, with complementary gate drive signals that swing from one supply rail to the other. The switch turns "on" when the NMOS gate is high and the PMOS gate is low, and the switch turns "off" when the NMOS gate is low and the PMOS gate is high. This simple operation allows the switch to be operated in as few as two clock phases, without requiring any intervening phases that would reduce the time available for operation of the sampling circuit (i.e., for charging and discharging the capacitive storage elements).

The "on" resistance of the transmission gate increases with decreasing supply voltage (i.e. decreased gate drive voltage). A large switch "on" resistance typically increases the settling time of the sampling circuits: the combination of the MOS switch resistance and the capacitance of the capacitive storage elements results in an RC settling time-constant associated with each capacitor. Furthermore, as is well known, when the transmission gate is turned "on", the resistance of the switch is a nonlinear function of the signal voltage coupled by the switch. With rapidly changing signal voltages, this nonlinear "on" resistance leads to distortion of the signal coupled onto the storage capacitor. Making the "on" resistance of the switch low, and/or making the "on" resistance of the switch constant (i.e., independent of signal voltage), will lead to reduced distortion of the coupled signal.

Modern advancements in MOS processing techniques continue to provide smaller MOS FET device geometries. Smaller device geometries advantageously yield smaller parasitic capacitances; however, as device geometries decrease, a corresponding reduction is required in the supply voltage due to lower breakdown voltages in the devices. For example, as a MOS transistor process size decreases from 0.6 micron to 0.3 micron, the supply voltage rating may typically decrease from 5 volts to 3 volts, respectively.

As the supply voltage is decreased, it becomes more difficult to maintain low "on" resistance in MOS FET switching devices. A smaller gate drive voltage signal swing provides smaller Vgs in the switching devices. This increases the "on" resistance of the switching transistors and thereby increases distortion and settling time. Therefore as the supply voltage is decreased, techniques must be developed to increase the gate drive beyond the supply rail to maintain a low "on" resistance.

One prior art circuit aimed at increasing the gate drive voltage signal swing is called a "clock doubler" circuit, such as that described in a 10-*Bit, 20-MS/s, 35-mW Pipeline A/D Converter*, by Thomas Cho and Paul Grey, Department of Electrical Engineering and Computer Sciences, University of California, Berkeley, IEEE 1994 Custom Integrated Circuits Conference. This circuit operates to increase the clock signal (i.e., the switch gate drive signal) to approximately twice the supply voltage.

While clock doubler circuits may be made to operate reliably, such circuits may stress the breakdown limits of the switching transistors. In particular, the applicants herein have discovered that clock doubler circuits do not work reliably in smaller geometry processes because the double amplitude gate drive voltages produced by clock doubler circuits will exceed breakdown voltages of the switching transistors.

There also exist a number of prior art circuits aimed at maintaining a relatively low and constant MOS transistor device "on" resistance, each circuit having its own drawbacks or limitations. One such circuit is that described in U.S. Pat. No. 5,084,634 to Gorecki. The Gorecki circuit is directed for use in a continuous-to-discrete time sampling circuit employing a MOS transistor device that receives an input voltage to be sampled. In four clock phases, a bootstrap capacitor is charged and the voltage on one plate thereof is boosted. At the end of the four phases, a boosted version of the input voltage is provided as the gate drive voltage to the MOS transistor device in an attempt to maintain the "on" resistance thereof constant. One significant limitation with Gorecki is that its operation requires four clock phases. Furthermore, the Gorecki circuit will not work reliably with smaller geometry processes because the large amplitude gate drive voltages produced by the circuit will exceed breakdown voltages of the switching transistors.

Another prior art circuit aimed at maintaining constant "on" resistance of a MOS transistor switch is that described in U.S. Pat. No. 5,500,612 to Sauer. Like Gorecki, the Sauer circuit bootstraps the gate drive of the transistor switch to a boosted level of the input voltage. A limitation of the Sauer circuit is that its operation requires three clock phases. An additional limitation is that Sauer employs a transmission gate switch which has a nonlinear parasitic capacitance that will distort the coupled input signal.

A further prior art circuit aimed at maintaining constant "on" resistance of a MOS transistor switch is that described in U.S. Pat. No. 5,170,075 to deWit. Like Gorecki and Sauer, deWit ties the gate drive voltage of the MOS transistor switch to a boosted level of the input voltage. A drawback of deWit is that deWit does nothing to ensure that the gate drive voltage does not exceed the breakdown voltage of the transistor. In addition, like Sauer, a transmission gate switch is employed, which has a nonlinear parasitic capacitance that will distort the coupled input signal.

It is a general object of the present invention to provide a circuit and method for producing an improved MOS FET switch. The improved MOS FET switch disclosed herein operates on only two clock phases, enabling higher speed operation, provides a nearly constant "on" resistance and parasitic capacitance to reduce distortion, and avoids stressing any devices beyond their breakdown voltages making it suitable for use on smaller geometry processes.

SUMMARY OF THE INVENTION

An embodiment of the invention is directed to a circuit that produces a control voltage for a transistor switch that receives an input voltage on a terminal thereof. The circuit includes a first input that receives the input voltage, a second input that receives a bias voltage, and a voltage storage element. A first switch connects the voltage storage element to sample one of the input voltage and the bias voltage during a first of first and second time intervals. A second switch connects the voltage storage element to increase the sampled voltage by the other of the input voltage and the bias voltage to the control voltage during the second time interval, while maintaining the control voltage less than a breakdown voltage of the transistor switch. A third switch connects the voltage storage element to provide the control voltage to the transistor switch.

In one embodiment, the voltage storage element includes a capacitor.

In an embodiment, the transistor switch includes a MOS transistor, the control voltage drives a gate of the MOS transistor and the first and second time intervals are non-overlapping.

In an embodiment, the gate-to-source voltage of the MOS transistor is maintained approximately constant during the second time interval.

In one embodiment, the first switch connects the voltage storage element to sample the input voltage during the first non-overlapping time interval. In this embodiment, the second switch connects the voltage storage element to increase the sampled voltage by the bias voltage during the second non-overlapping time interval.

In another embodiment, the first switch connects the voltage storage element to sample the bias voltage during the first non-overlapping time interval. In this other embodiment, the second switch connects the voltage storage element to increase the sampled voltage by the input voltage during the second non-overlapping time interval. In one version of this embodiment, the second switch includes a MOS transistor, the gate-to-source voltage of which is maintained approximately constant. In a version of this embodiment, the third switch includes a MOS transistor, the gate-to-source voltage of which is maintained approximately constant.

In an embodiment, the circuit further includes a buffering circuit that buffers the input voltage before either being sampled unto the voltage storage element or before increasing the sampled voltage, depending on the embodiment of the invention.

Another embodiment of the invention is directed to a method for producing a control voltage for a transistor switch that receives an input voltage on a terminal thereof. The method comprises the following steps: sampling one of a bias voltage and the input voltage onto a voltage storage element during a first of first and second time intervals; increasing the sampled voltage by another of the bias voltage and the input voltage to the control voltage during the second time interval, while maintaining the control voltage less than a breakdown voltage of the transistor switch; and providing the gate drive voltage to the transistor switch during the second time interval.

In an embodiment, the transistor switch includes a MOS transistor, the control voltage drives a gate of the MOS transistor, the first and second time intervals are non-overlapping, and a gate-to-source voltage of the MOS transistor is maintained approximately constant during the second time interval.

In an embodiment, the step of sampling includes the step of sampling the input voltage onto the voltage storage element during the first non-overlapping time interval. In this embodiment, the step of increasing includes the step of increasing the sampled voltage by the bias voltage during the second non-overlapping time interval.

In another embodiment, the step of sampling includes the step of sampling the bias voltage onto the voltage storage element during the first non-overlapping time interval. In this other embodiment, the step of increasing includes the step of increasing the sampled voltage by the input voltage during the second non-overlapping time interval.

In an embodiment, the method further includes the step of buffering the input voltage before either the step of sampling or the step of increasing, or both.

The features and advantages of the present invention will be more readily understood and apparent from the following detailed description of the invention, which should be read in conjunction with the accompanying drawings and from the claims which are appended to the end of the detailed description.

BRIEF DESCRIPTION OF THE DRAWING

For a better understanding of the present invention, reference is made to the accompanying drawings, which are incorporated herein by reference and in which.

DETAILED DESCRIPTION

Applicants have discovered that a transmission gate switch has a number of drawbacks that limit its use as a switch in high-performance, high-speed continuous-to-discrete time interface circuits and switched-capacitor circuits, such as those used in analog-to-digital converters (ADCs). Several drawbacks were described above, including the nonlinear "on" resistance of the transmission gate switch and the effect of a decreasing supply voltage on the "on" resistance. An additional drawback discovered by the applicants is described below.

The parasitic capacitance of the transmission gate switch is a nonlinear function of the signal voltage coupled by the switch. As the signal voltage approaches either supply rail, either the NMOS or PMOS device turns "off" (i.e., as Vgs drops below Vt of the device), and both the resistance and parasitic capacitance of the transmission gate switch change abruptly. For example, as the input signal Vin approaches the negative supply rail V--, the PMOS transistor in the switch will turn "off" when its source-to-gate voltage Vsg drops below the threshold voltage of the PMOS transistor, Vt. When this occurs, the channel beneath the gate is pinched off, and the various device capacitances and charges redistribute themselves. For example, when the channel becomes pinched off, the channel charge must flow out of the channel region towards the source/drain regions. Also, the channel-to-bulk capacitance drops to zero, while the gate-to-bulk capacitance increases sharply. Provided that the circuit driving the transmission gate switch (i.e., providing the input signal voltage Vin) has a low enough impedance, these changes in the transistor may have a negligible effect on the value of the signal voltage Vin. In most practical applications, however, the impedance of the circuit providing the input signal voltage Vin has a finite value, perhaps 50 ohms or more. It is this situation that results in distortion of the input signal Vin.

As one of the transistors begins to turn "off", current flows out of the source/drain regions as the channel charge is drained. Some of this current flows in the impedance of the circuit providing the signal voltage Vin, resulting in the voltage changing momentarily from its nominal value. At the same time, as the channel-to-bulk capacitance drops to zero, the total capacitance on the source and drain nodes of the transistor drops as well.

There are time constants resulting from the interaction of the impedance of the circuit providing the input signal voltage Vin, the "on" resistance of the switch, the parasitic capacitances of the switch, and any capacitive elements coupled to the switch. As the parasitic capacitances change abruptly (i.e., as one of the transistors turns "off"), the time constants will change abruptly as well. This causes distortion of the time-varying input signal voltage Vin. This distortion increases with increasing frequency of the input signal voltage Vin, and limits the performance of the switch with high-frequency input signals.

It should be appreciated that any transistor coupled to the input signal that turns "off" or "on" as a function of the input signal voltage Vin (e.g., the transistors in the transmission gate switch described above), will cause distortion of the input signal through interactions with the finite impedance of the circuit providing the input signal voltage Vin. The prior art circuits of Sauer and deWit both use transmission gate switches coupled to the input signal. Therefore, both these circuits suffer from the distortion mechanism described above.

The present invention relates to a circuit that produces a gate drive voltage for a MOS transistor switch. Three embodiments of the invention are disclosed herein. One embodiment is directed to a circuit that boosts the supply voltage to produce the gate drive voltage, while still insuring device stress protection by maintaining a high voltage level of the gate drive voltage below a breakdown voltage of the device. The other two embodiments relate to bootstrapping the gate drive voltage to a boosted level of the input voltage to the MOS transistor device to maintain a relatively constant "on" resistance of the device. These embodiments also insure device stress protection and limit nonlinear parasitic capacitances, which may introduce distortion.

Figure 1:
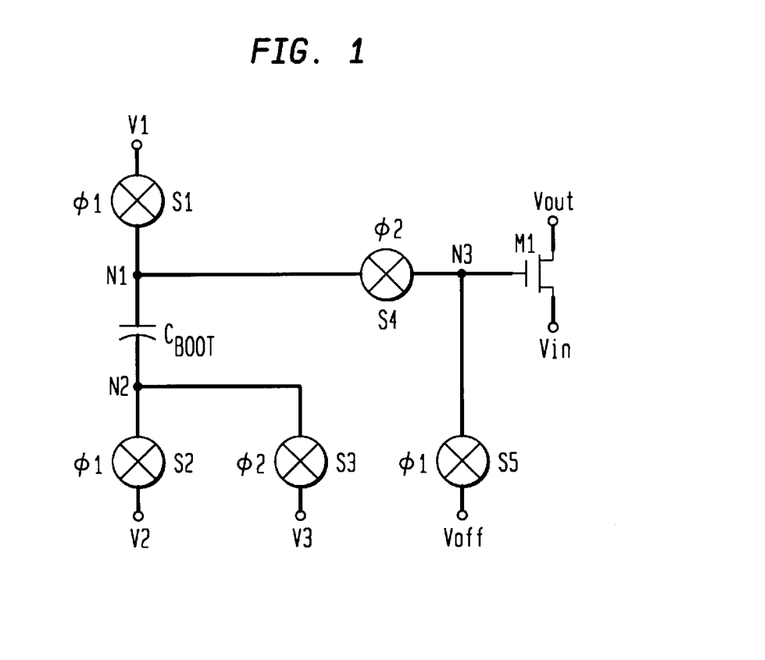
FIG. 1 is a general schematic diagram of the circuit of the invention.
Figure 2:
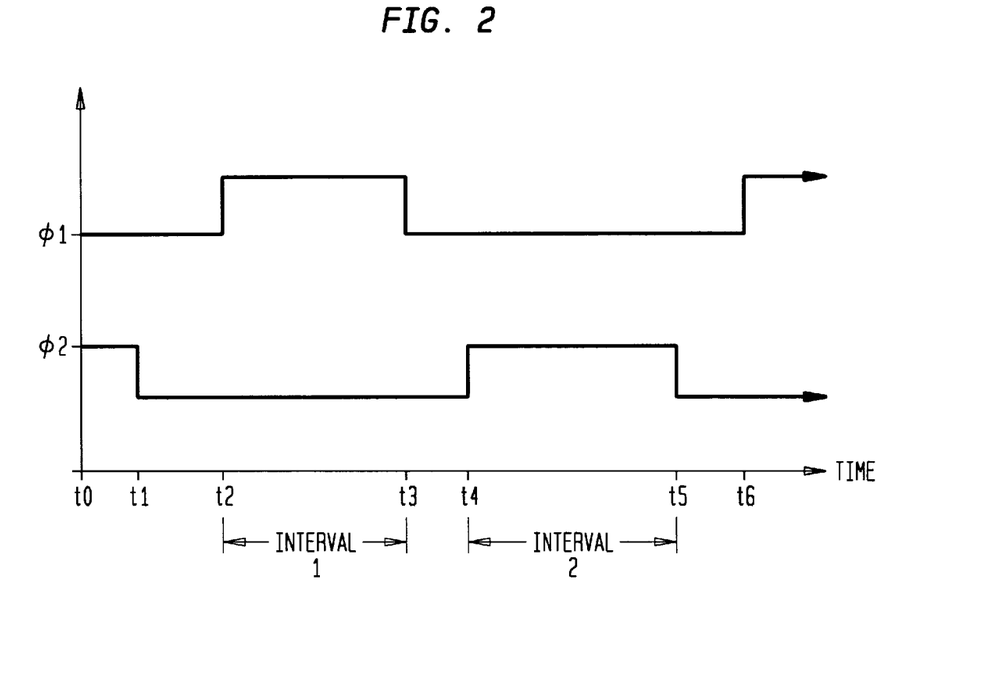
FIG. 2 is a timing diagram of the switch control signals employed in the circuit of FIG. 1.

A general schematic diagram of the invention is shown in FIG. 1, to which all embodiments of the invention relate. Alternative embodiments are shown in FIGS. 3, 4, 6 and 7. Same reference characters for like elements are used throughout. The circuit shown in FIG. 1 produces a gate drive voltage "on" node N3 for MOS transistor device M1 in two non-overlapping time intervals (clock phases), Interval 1 and Interval 2 (shown in FIG. 2). The gate drive voltage is provided to turn transistor M1 "off" during a first time interval (interval 1 as shown in FIG. 2), and to turn transistor M1 "on" during a second time interval (interval 2 as shown in FIG. 2). The circuit of the invention includes capacitor $C_{BOOT}$ as well as five switches labeled S1, S2, S3, S4 and S5.

Transistor M1 receives an input voltage Vin (i.e., on its source terminal) and provides an output voltage Vout (i.e., on its drain terminal), when "on". Transistor M1 may be an N-channel transistor or a P-channel transistor. Transistor M1 may form part of a discrete time analog sampling circuit, such as a switched-capacitor circuit, which samples input voltage Vin. Transistor M1 has an associated breakdown voltage Vbreakdown, a turn-on threshold voltage Vt, an "on" resistance Ron, and a parasitic capacitance, Cp.

In one embodiment of the invention, the gate drive voltage provided to node N3 to turn-on transistor M1 exceeds a supply voltage provided to the circuit yet is maintained below the breakdown voltage Vbreakdown of transistor M1 to insure that transistor M1 does not become stressed. In other embodiments of the invention, the gate drive voltage provided to node N3 to turn "on" transistor M1 is equal to the value of input voltage Vin plus a fixed voltage, such as the supply voltage or a bias voltage. This gate drive voltage results in a substantially constant gate-to-source voltage (Vgs) of transistor M1, equal to the fixed voltage and substantially independent of the input voltage Vin. This constant Vgs results in a substantially constant "on" resistance Ron of transistor M1. Additionally, Vgs can be maintained below the gate-to-source breakdown voltage of transistor M1 by appropriate choice of the fixed voltage, thus providing stress protection of the transistor M1.

As shown in FIG. 1, each of switches S1–S5 is controlled (to open and close) by one of two switch control signals Φ1 and Φ2, labeled next to the switch it controls. A timing diagram for the switch control signals Φ1 and Φ2 is shown in FIG. 2. Each is shown on the same time axis. The placement of one above the other on the same time axis is done for illustrative purposes only and does not indicate that one attains a higher voltage level than the other.

As shown in FIG. 2, signal Φ2 starts off high and goes low at time t1, with signal Φ1 starting low. At time t2, with signal Φ2 being low, signal Φ1 goes high. Then at time t3, while signal Φ2 remains low, signal Φ1 goes low. This entire time period t2–t3 during which signal Φ1 is high is referred to herein as Interval 1. With signal Φ1 low, at time t4, signal Φ2 goes high. With signal Φ1 still remaining low, signal Φ2 goes low, at time t5. This time period t4–t5 during which signal Φ2 is high is referred to herein as Interval 2. Then, at time t6, signal Φ1 goes high beginning another Interval 1 again. The interval lengths are exemplary and may not be drawn to scale. Actual interval lengths may vary depending on application.

Switches S1, S2 and S5 of FIG. 1, controlled by signal Φ1, are closed ("on") when signal Φ1 is high and are open ("off") when signal Φ1 is low. Switches S3 and S4, controlled by signal Φ2, similarly, are closed ("on") when signal Φ2 is high and are opened ("off") when signal Φ2 is low.

The circuit of FIG. 1 operates as follows during the two-time intervals, Interval 1 and Interval 2. At time t1, signal Φ2 goes low, opening switches S3 and S4. During Interval 1, at time t2 when signal Φ1 goes high, switches S1, S2 and S5 close, while switches S3 and S4 remain open. Node N3 is connected through switch S5 to be at voltage Voff, which voltage is selected to turn transistor M1 "off".

Voltage V1 is connected through switch S1 to node N1, connected to the top plate of capacitor $C_{BOOT}$. Similarly, voltage V2 is connected through switch S2 to node N2, connected to the bottom plate of capacitor $C_{BOOT}$. Therefore, capacitor $C_{BOOT}$ is charged to a voltage V1–V2. At the end of Interval 1, at time t3, switches S1 and S2 open, sampling the charge related to voltage V1–V2 onto capacitor $C_{BOOT}$. Switch S5 also opens.

Then, at the beginning of Interval 2, at time t4, switches S3 and S4 close. Voltage V3 is connected through switch S3 to node N2, altering the voltage "on" node N1 by V3 to V1–V2+V3. This voltage V1–V2+V3 "on" node N1 is provided through switch S4 to node N3 as the gate drive voltage of transistor M1 during time Interval 2, turning "on" transistor M1.

As will be described in greater detail below, in each of the embodiments of the invention, the voltages V1, V2 and V3 are controlled to produce the gate drive voltage such that it turns "on" transistor M1 sufficiently when desired yet avoids stressing transistor M1 beyond its breakdown voltages and, in two of the embodiments, maintains a substantially constant "on" resistance Ron of transistor M1. Advantageously, this all is accomplished in two time intervals or clock phases.

Figure 3:
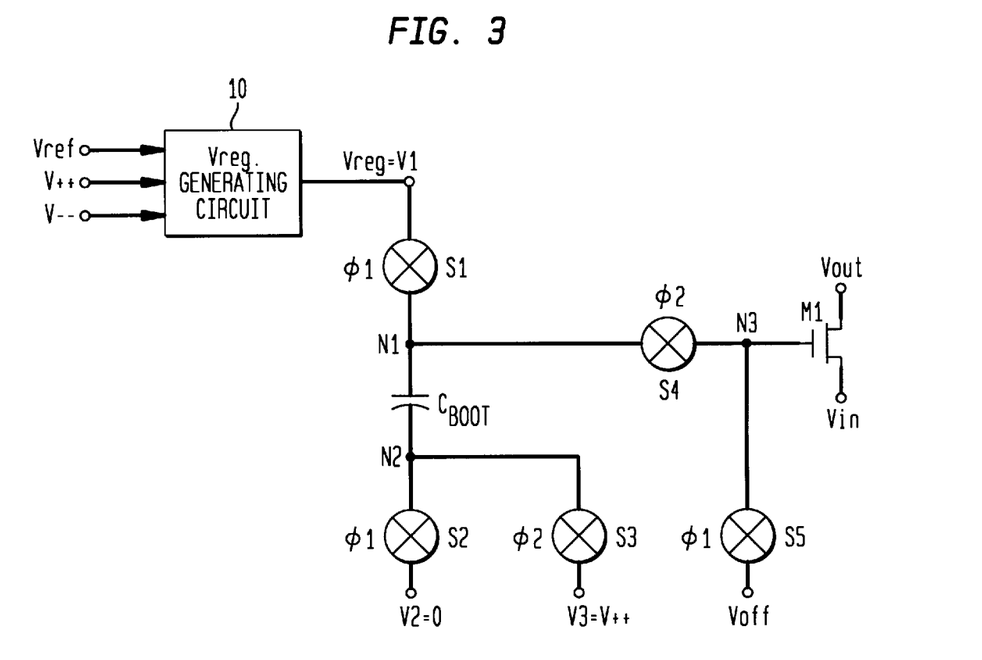
FIG. 3 is a part block, part schematic diagram of a first embodiment of the invention.

FIG. 3 is a part block, part schematic diagram of a first embodiment of the invention. In the embodiment of FIG. 3, the gate drive voltage is controlled such that a high level of the gate drive voltage adequately turns "on" transistor M1 yet is maintained below a breakdown voltage of transistor M1 to insure stress protection of transistor M1. In the embodiment of FIG. 3, voltage V1 is made equal to a produced regulated voltage Vreg, voltage V2 is made equal to negative supply voltage V−− (e.g., zero volts), and voltage V3 is made equal to a positive supply voltage V++. The regulated voltage Vreg is produced by a regulated voltage generating circuit 10.

In one embodiment, regulated voltage generating circuit 10 receives a reference voltage Vref, the positive supply voltage V++ and the negative supply voltage V−−, from which it produces the regulated voltage Vreg. The remainder of the circuit, in this general diagram of the first embodiment, is identical to and operates as does the diagram circuit of FIG. 1.

During Interval 1, with switches S1, S2 and S5 closed, and switches S3 and S4 opened, capacitor $C_{BOOT}$ is charged to the regulated voltage Vreg. The charge related to this regulated voltage Vreg is sampled onto capacitor $C_{BOOT}$ at the end of Interval 1. During Interval 2, with switches S1, S2 and S5 opened, and switches S3 and S4 closed, the voltage at node N1 is increased by positive supply voltage V++ to the regulated voltage Vreg plus the positive supply voltage V++, yielding a gate drive voltage of Vreg+V++. The gate drive voltage Vreg+V++ is provided through switch S4 to node N3, turning "on" transistor M1.

The regulated voltage Vreg is controlled such that a high level of the gate drive voltage exceeds the positive supply voltage V++, to adequately turn "on" transistor M1, yet is maintained below a breakdown voltage Vbreakdown of transistor M1, to insure stress protection of transistor M1. In one embodiment of the invention, the regulated voltage Vreg is produced according to the following. When Vbreakdown>2 V++, Vreg<V++. When Vbreakdown<2 V++, Vreg<Vbreakdown−V++.

Figure 4:
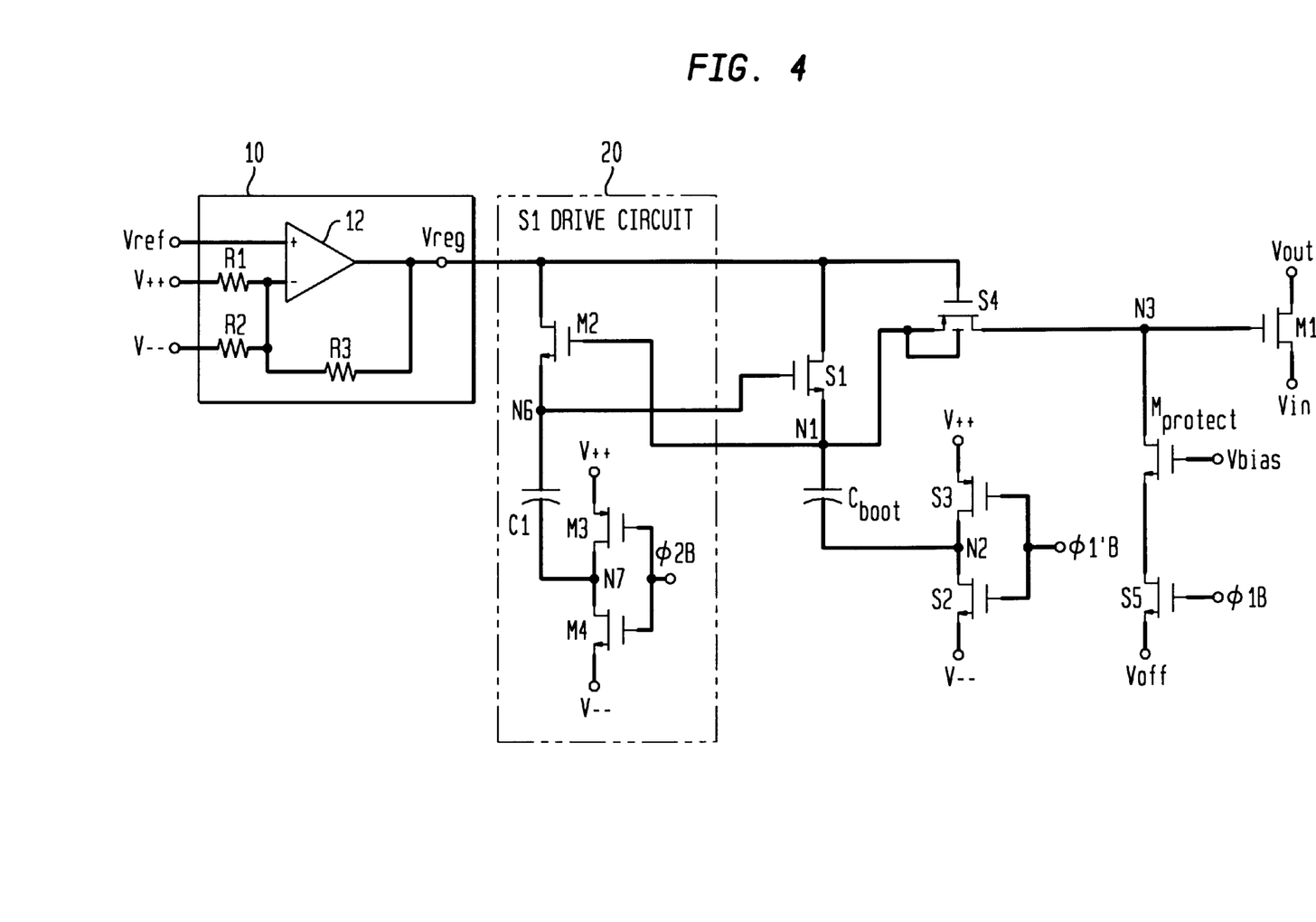
FIG. 4 is a more detailed schematic diagram of a particular implementation of the embodiment of the invention shown in FIG. 3.
Figure 5:
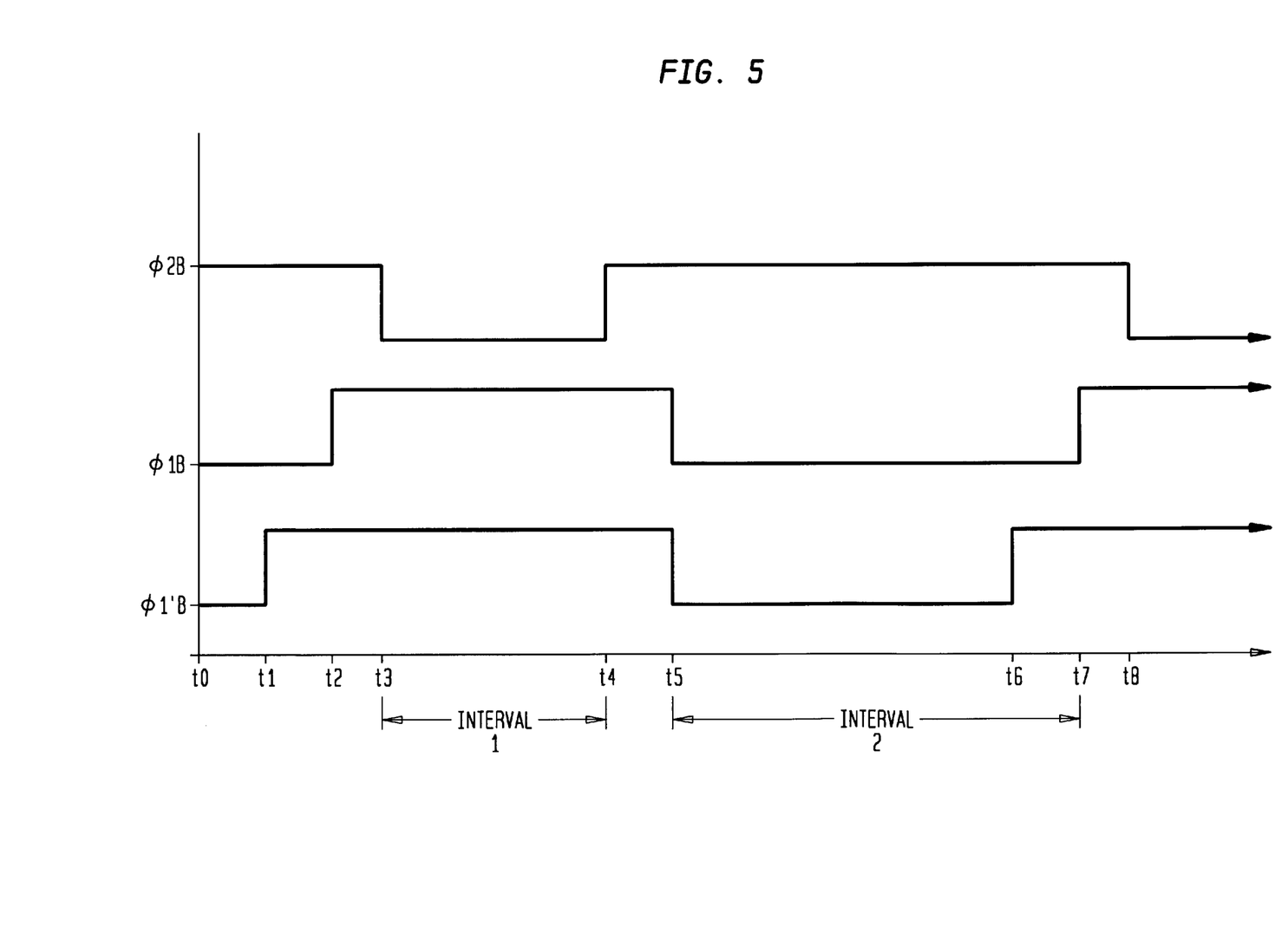
FIG. 5 is a timing diagram of the switch control signals employed in the circuits of FIGS. 4 and 6.

A specific implementation of the embodiment of the invention shown in FIG. 3 is shown in the detailed schematic circuit diagram of FIG. 4. A timing diagram of the switch control signals, used to control operation of the switches of FIG. 4, is shown in FIG. 5. These signals include Φ1B, Φ2B, and Φ1'B. It should be appreciated from the timing diagram of FIG. 5, that Φ1B simply is the inverse of signal Φ1. Similarly, signal Φ2B simply is the inverse of signal Φ2. Both signals Φ1 and Φ2 are shown in the timing diagram of FIG. 2. Signal Φ1'B simply goes from low to high before signal Φ1B. Otherwise, signals Φ1'B and Φ1B are identical. The interval lengths shown are exemplary and may not be drawn to scale. Actual interval lengths may vary according to application.

The circuit of FIG. 4 includes a specific implementation of regulated voltage generating circuit 10. The regulated voltage generating circuit 10 shown includes an operational amplifier 12 having an inverting input terminal and a non-inverting input terminal. Op amp 12 receives a reference voltage Vref on its non-inverting input terminal. Op amp 12 receives positive supply voltage V++ through resistor R1 on its inverting input terminal. Op amp 12 also receives negative supply voltage V−− through resistor R2 on its inverting input terminal. A resistor R3 is connected in feedback between the output and inverting input terminal. The voltage produced at the output of the op amp is the regulated voltage Vreg, which is easily calculated to be Vreg=A*Vref−B*V++−C*V−−, where A=(R1*R2+R2*R3+R1*R3)/(R1*R2), B=R3/R1, and C=R3/R2.

By appropriate choices of resistors R1–R3, voltage Vreg can be made to inversely track the positive supply voltage, $V_{++}$, so that the gate drive voltage "on" node N3 during Interval 2 (i.e., when transistor M1 is turned "on"), which is equal to Vreg+$V_{++}$−V−−, remains constant independent of the supply voltage, $V_{++}$. During Interval 2, when transistor M1 is turned "on", the gate-to-source voltage (Vgs) of transistor M1 is equal to the voltage difference between the gate drive voltage and the input signal voltage, Vin. By appropriate choices of resistors R1–R3 and reference voltage Vref, the gate drive voltage can be maintained less than the minimum value of the input voltage, $Vin_{min}$, plus the gate-to-source breakdown voltage, Vbreakdown, of transistor M1 (i.e., less than $Vin_{min}$+Vbreakdown), so that the Vgs of transistor M1 will never exceed Vbreakdown.

In the circuit of FIG. 4, switch S1 consists of an NMOS transistor, that receives a gate drive voltage from S1 drive circuit 20. Switch S3 consists of a PMOS transistor and switch S2 consists of a NMOS transistor. The drains of transistors S2 and S3 are tied together and to node N2. The gates of transistors S2 and S3 both are driven by signal Φ1'B such that transistor S2 is "on" and transistor S3 is "off" when Φ1'B is high, and transistor S3 is "on" and transistor S2 is "off" when Φ1'B is low. Switch S4 consists of a PMOS transistor driven by regulated voltage Vreg. Switch S5 consists of an NMOS transistor controlled by signal Φ1B and connected in series with a protection transistor $M_{protect}$ controlled by a bias voltage Vbias (which may be the positive supply voltage V++).

S1 drive circuit 20, which provides the gate drive voltage for transistor S1, insures that transistor S1 turns "on" during Interval 1, regardless of the voltage level of the regulated voltage Vreg. It should be appreciated that S1 drive circuit 20 as shown in FIG. 4 is exemplary and that other embodiments that provide the same function could be used for this purpose. Transistor S1 drive circuit 20 consists of an NMOS transistor M2, the gate of which is connected to node N1 (the source of transistor S1 and top plate of capacitor $C_{BOOT}$), the drain of which is connected to receive the regulated voltage Vreg, and the source of which is connected to node N6, which is connected to the gate of transistor S1. Node N6 also is connected to the top plate of capacitor C1.

A PMOS transistor M3 is connected to receive positive supply voltage V++ and an NMOS transistor M4 is connected to receive negative supply voltage V−−. Both drains of the two transistors M3 and M4 are connected together and to node N7, and both M3 and M4 are driven by control signal Φ2B, such that when M3 is "on", M4 is "off", and when M4 is "on", M3 is "off". Node N7 is connected to the bottom plate of capacitor C1.

Operation of the circuit of FIG. 4 will be described in detail. At time t1, Φ1'B goes high, turning "off" switch S3 and turning "on" switch S2, bringing node N2 to negative supply voltage V−−.

At time t2, signal Φ1B goes high, turning "on" transistor S5, bringing node N3 to voltage Voff, turning "off" transistor M1.

During Interval 1, with signals Φ1'B and Φ1B remaining high, at time t3, signal Φ12B goes low. Transistor M3 turns "on" and transistor M4 turns "off" bringing node N7 to positive supply voltage V++. From a previous interval, the voltage at node N6 is at V++−V−−+Vreg (old). Transistor switch S1 turns "on", bringing node N1 to the regulated voltage Vreg. Because node N1 is at Vreg, transistor S4 is "off" and transistor M2 is "off". Capacitor $C_{BOOT}$ is charged to Vreg−V−−.

At time t4, signal Φ2B goes high while both Φ1B and Φ1'B remain high. When signal Φ2B goes high, transistor M4 turns "on" and transistor M3 turns "off". This brings node N7 to negative supply voltage V−− which, in turn, brings node N6 to voltage Vreg (old). This turns transistor S1 "off" which causes the charge relating to voltage Vreg−V−− to be sampled onto capacitor $C_{BOOT}$.

At time t5, both signals Φ1B and Φ1'B go low. This turns "off" transistor S5. It also turns "off" transistor S2 and turns "on" transistor S3, bringing node N2 to voltage V++. This in turn brings node N1 to the gate drive voltage of Vreg+V++−V−−. The voltage "on" node N1 turns "on" transistor M2 bringing node N6 to regulated voltage Vreg. The voltage at node N1 also turns "on" transistor S4 supplying the gate drive voltage of Vreg+V++−V−− to node N3, turning "on" transistor M1.

At time t6, signal Φ1'B goes high, turning "on" transistor S2 and turning "off" transistor S3, bringing node N2 to negative supply voltage V−−. This brings the voltage "on" node N1 to Vreg, turning "off" transistor M2 and transistor S4. The turning "off" of transistor M2 causes the sampling onto capacitor C1 of charge relating to voltage Vreg−V−−.

At time t7, signal Φ1B goes high turning "on" transistor S5 bringing node N3 to voltage Voff, turning "off" transistor M1 and repeating the process.

It should be appreciated that protection transistor $M_{protect}$ is connected in series with switching transistor S5 to protect switching transistor S5. A voltage drop from node N3 to voltage Voff is shared across protection transistor $M_{protect}$ and transistor S5 so that neither the drain-to-source voltage Vds of S5 nor the drain-to-source voltage Vds of $M_{protect}$ exceeds its breakdown limit.

It also should be appreciated that transistor S4 is arranged to have gate stress protection. The gate of transistor S4 is connected to receive the regulated voltage Vreg. The source of transistor S4 is connected to node N1. Because transistor S4 is a PMOS transistor, when the voltage at node N1 exceeds the regulated voltage Vreg by at least the turn-on threshold voltage Vt of transistor S4, transistor S4 is turned "on". The source of transistor S4 will increase to Vreg+V++−V−−, which results in a voltage drop of V++−V−− across the gate and source terminals of transistor S4. Since V++−V−− must be less than the gate-to-source breakdown voltage of the process, transistor S4 is not stressed beyond its gate-to-source breakdown voltage. As shown in FIG. 4, the well of PMOS transistor S4 preferably is connected to node N1 to avoid turning "on" the source/drain-to-well parasitic diodes in the PMOS device.

Because transistors S2 and S3 are connected to alternately provide positive supply voltage V++, then negative supply voltage V−− to node N2, a clock signal alternatively could be connected to node N2 for the same purpose, replacing transistors S2 and S3. The same is true with respect to replacing transistors M3 and M4, both connected to node N7, with a clock signal A second embodiment of the circuit of the invention is shown in schematic diagram form in FIG. 6. With reference to FIG. 1, in the embodiment of FIG. 6, V1=Vin, V2=V−− and V3=V++. In this second embodiment, the input voltage Vin−V−− is sampled onto capacitor $C_{BOOT}$ during Interval 1 and that voltage is boosted by V++ during Interval 2, and provided as the gate drive voltage. The gate drive voltage thus is a boosted version of a sample of the input voltage, maintaining a relatively constant "on" resistance Ron of transistor M1, as explained below.

Figure 6:
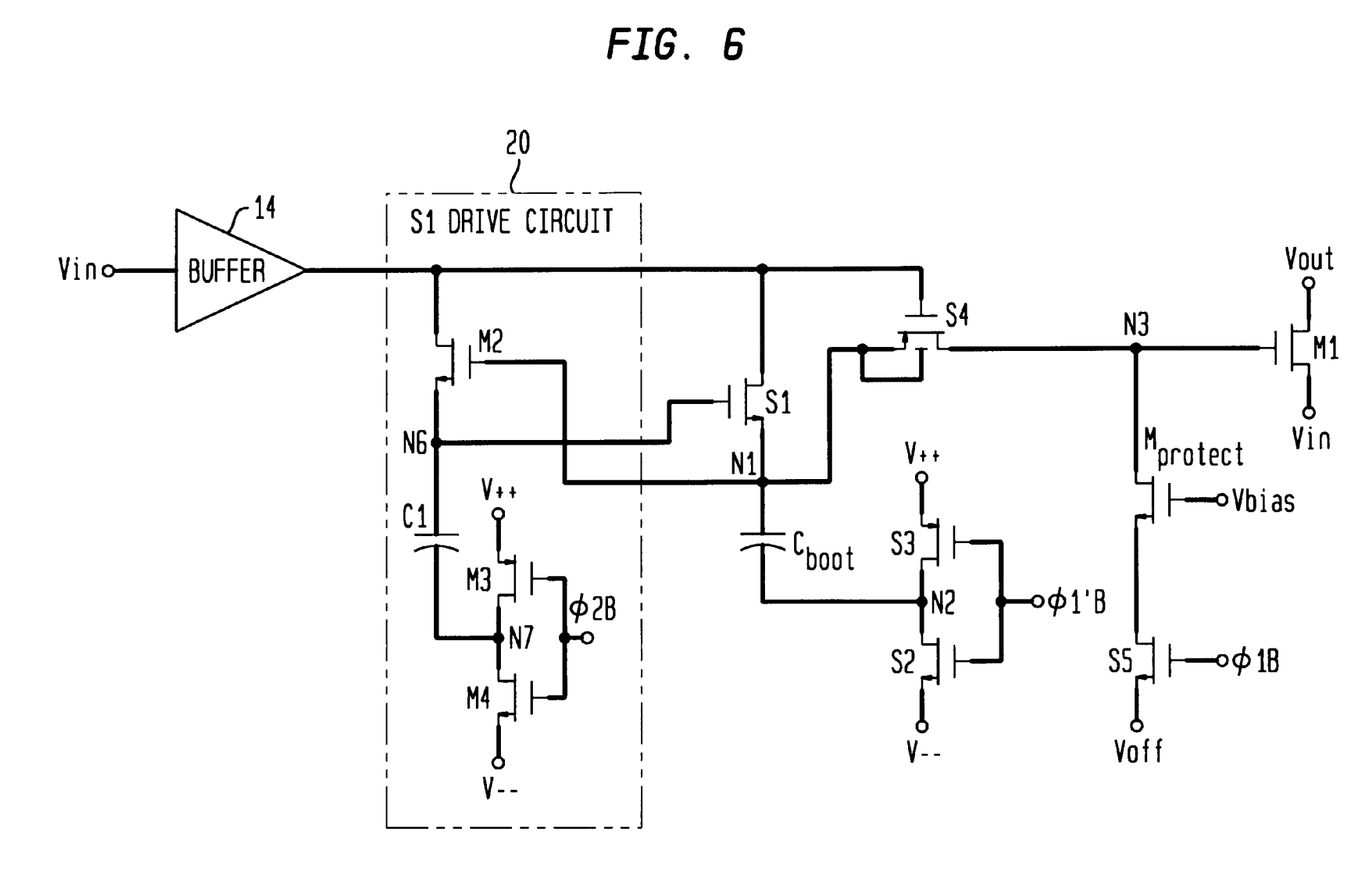
FIG. 6 is a schematic diagram of another embodiment of the invention.

The circuit shown in FIG. 6 is identical to that shown in FIG. 4 except that the regulated voltage generating circuit 10 in FIG. 4 is replaced by a voltage buffer 14 that receives input voltage Vin and provides a buffered version of input voltage Vin as voltage V1 (from FIG. 1). The circuit operates similarly to that of FIG. 4 with the same transistor control signals Φ1'B, Φ1B and Φ2B, shown in the timing diagram of FIG. 5.

The circuit of FIG. 6 is, however, quite different from that of FIG. 4 in that a buffered version of input voltage Vin is provided as voltage V1 such that capacitor $C_{BOOT}$ is charged to Vin−V−− during Interval 1. At the end of Interval 1 (i.e., at time t4 on FIG. 5), Φ2B goes high, causing node N2 to go low, causing node N6 to drop, which turns "off" transistor S1. When S1 turns "off", the charge corresponding to the voltage across $C_{BOOT}$, Vin−V−−, is sampled onto capacitor $C_{BOOT}$, resulting in a voltage drop across $C_{BOOT}$ equal to $Vin_{SAMPLED}$−V−−. During Interval 2, node N2 rises to V++ causing node N1 to rise to V++ plus $Vin_{SAMPLED}$−V−−. This gate drive voltage $Vin_{SAMPLED}$+V++−V−− is provided to node N3 to turn "on" transistor M1 during Interval 2. Because the gate drive voltage is equal to a sample of the input voltage Vin plus the difference between the positive supply voltage V++ and negative supply voltage V−−, and the source voltage of transistor M1 is equal to the input voltage Vin, the gate-to-source voltage Vgs of transistor M1 is approximately equal to V++−V−−. This approximately constant Vgs results in a relatively constant "on" resistance Ron of transistor M1, which leads to reduced distortion of the signal coupled between the source and drain of transistor M1.

Additionally, since the transistor M1 is fully turned "on" by a constant Vgs that is much larger than the threshold voltage Vt of the transistor, its parasitic capacitances vary by only a small, weakly nonlinear amount as the input signal Vin varies over a wide range (from as low as the negative supply voltage V−− to as high as the positive supply voltage V++). This is in contrast to a transmission gate, whose dominant parasitic capacitances change abruptly and in a very nonlinear fashion as the signal voltage Vin varies over a wide range, as described above. The parasitic capacitance of transistor M1 interacts with both the finite impedance of the circuit providing input signal voltage Vin and the "on"

resistance Ron of transistor M1. Because the parasitic capacitance of transistor M1 remains approximately constant, this interaction does not result in distortion of the input signal voltage Vin.

Moreover, because the Vgs of transistor M1 is maintained at V++−V−− during Interval 2, the gate-to-source breakdown voltage of transistor M1 is never exceeded. Thus, a constant "on" resistance, a nearly constant parasitic capacitance, and device stress protection are provided for a very wide range of input voltages and frequencies.

However, in the embodiment of FIG. 6, it should be appreciated that if the input signal Vin changes significantly between the end of Interval 1 and the end of Interval 2, then Vin$_{SAMPLED}$ will not be equal to Vin, and the Vgs of transistor M1 will vary significantly. This will cause the "on" resistance Ron of transistor M1 to be non-constant. Therefore, the embodiment of FIG. 6 is directed towards applications in which the input signal Vin does not change appreciably between the end of Interval 1 and the end of Interval 2. A typical application for this circuit that meets these requirements is an oversampling circuit in which the frequency components of Vin are low compared to the clock frequency (e.g., a baseband sigma-delta converter).

While the input voltage provided to transistors S1 and S4 is shown as a buffered version of the input voltage Vin in FIG. 6, it should be appreciated that a direct connection of the input voltage Vin alternatively could be provided to transistor S1 and/or transistor S4.

Figure 7:
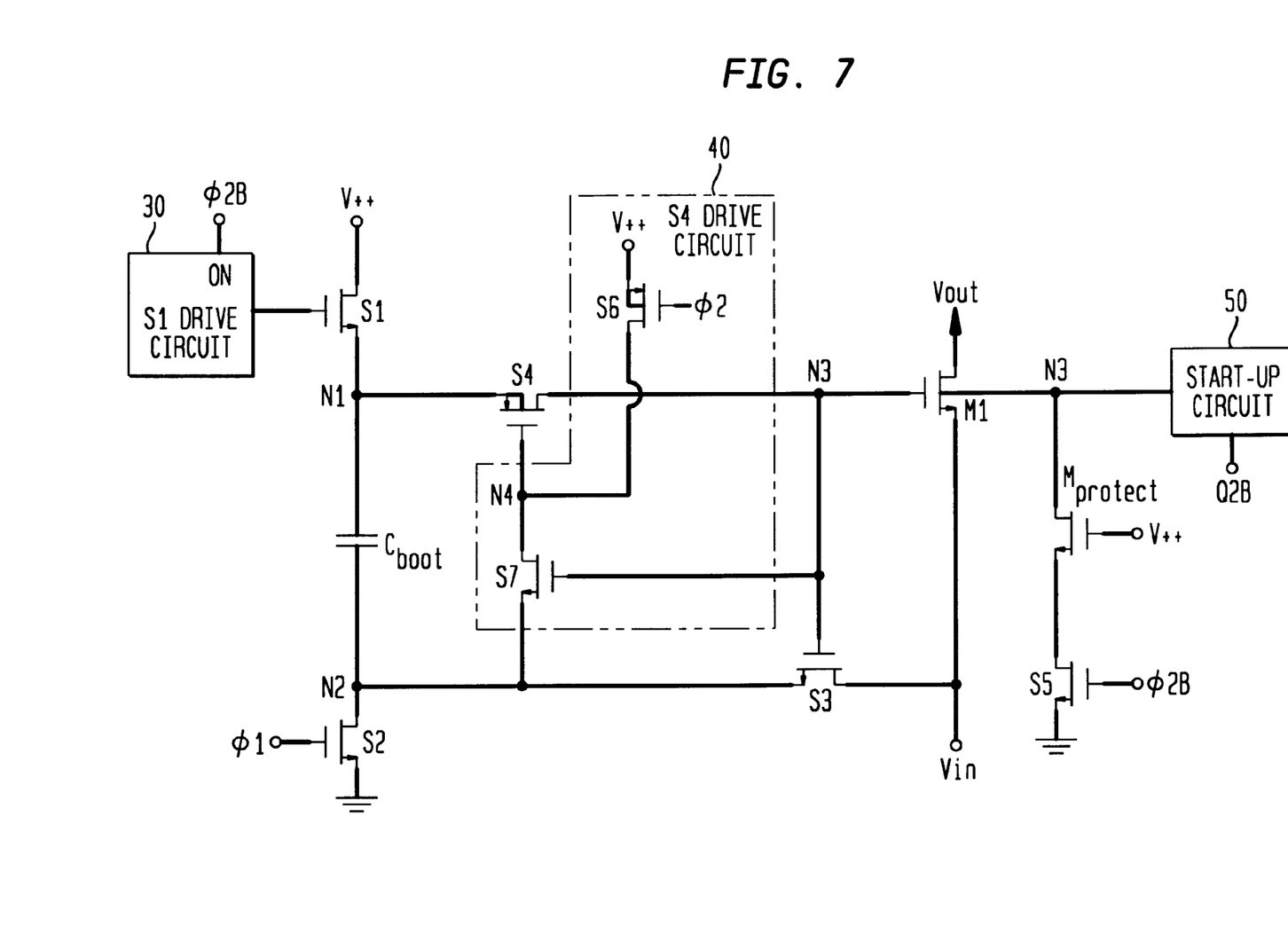
FIG. 7 is a schematic diagram of a further embodiment of the invention.

FIG. 7 is a schematic diagram of the third embodiment of the circuit according to the invention. With reference to FIG. 1., in this third embodiment, V1 is equal to V++, V2 is equal to the negative supply voltage V−− and V3 is equal to Vin. In this third embodiment, the difference between the positive supply voltage V++ and negative supply voltage V−− is sampled onto capacitor C$_{BOOT}$ at the end of Interval 1 and that voltage is boosted by the input voltage Vin during Interval 2 and provided as the gate drive voltage of transistor M1, for maintaining a constant "on" resistance Ron of transistor M1, independent of the instantaneous voltage of Vin, and regardless of whether Vin changes between intervals.

The circuit of FIG. 7 includes an S1 drive circuit 30 that produces the gate drive voltage for NMOS transistor switch S1. S1 drive circuit 30 functions to produce the drive voltage of transistor S1 to be greater than the supply voltage V++ plus the threshold voltage Vt of S1 to turn "on" transistor S1 during Interval 1. Drive circuit 30 also produces the gate drive voltage of transistor S1 to be less than or equal to the positive supply voltage V++ plus the threshold voltage Vt of S1, turning "off" transistor S1 during Interval 2.

The circuit of FIG. 7 also includes an S4 drive circuit 40 that produces the gate drive voltage for PMOS transistor switch S4. Transistor S4 drive circuit 40 produces a gate drive voltage that turns transistor S4 "off" during Interval 1 and turns transistor S4 "on" during Interval 2. S4 drive circuit 40 maintains the gate drive voltage at node N4 at Vin during Interval 2 so as not to stress transistor S4, as will be described in more detail below.

Operation of the circuit of FIG. 7 will be described with respect to the timing diagram of FIG. 2. At time t1, signal Φ2 goes low (and Φ2B goes high), bringing node N3 to V$_{OFF}$, turning "off" transistors M1, S3 and S7. PMOS transistor S6 of S4 drive circuit 40 also turns "on", such that positive supply voltage V++ is at node N4. Also at time t1, S1 drive circuit 30 produces a gate drive signal that is greater than V++ plus the threshold voltage Vt of transistor S1, turning "on" transistor S1, which brings node N1 to V++. Because the positive supply voltage V++ is at node N1, and also at node N4, transistor S4 is turned "off". During Interval 1, at time t2, when signal Φ1 goes high and signal Φ2 is low, transistor S2 is turned "on" such that capacitor C$_{BOOT}$ charges to V++−V−−.

At time t3, signal Φ1 goes low turning transistor S2 "off", sampling the charge related to the difference between the positive supply voltage V++ and the negative supply V−− onto capacitor C$_{BOOT}$.

At time t4, signal Φ2 goes high (and signal Φ2B goes low), S1 drive circuit 30 provides gate drive voltage of transistor S1 less than the positive supply voltage V++ plus the threshold voltage Vt of transistor S1, turning "off" transistor. PMOS transistor S6 of S4 drive circuit 40 also is turned "off" as is NMOS transistor S5.

At this point, start up circuit 50, which acts as diode, and is controlled by signal Φ2B, pulls the voltage at node N3 up from VOFF. When the voltage at node N3 rises above a threshold voltage of each of transistors M1, S3 and S7, then such transistors begin to turn "on". When transistor S7 begins to turn "on", then transistor S4 begins to turn "on". Some of voltage Vin is provided through M1 transistor S3 to node N2 pushing the voltage at node N1 higher, further turning "on" transistor S4. This, in turn, raises the voltage at node N3, further turning "on" transistors S3 and S7 which enables more of voltage Vin to flow through transistor S3. As this process continues, the voltage at node N2 eventually is at input voltage Vin.

The voltage at node N1 is eventually at Vin+V++−V−−. This is the gate drive voltage and is provided through transistor S4, which then is fully turned "on", to node N3, turning "on" transistor M1. At time t5, signal Φ2 goes low, and transistors S1, S6 and S5 are turned "on". As a result, transistors S3, S4 and S7 are turned "off". In addition, transistor M1 is turned "off". Note that time t5 is identical to time t1, and the cycle may be repeated from this point.

As can be seen, because the gate drive voltage of transistor M1, provided during Interval 2, is equal to the input voltage Vin plus the difference between the positive supply voltage V++ and the negative supply voltage V−−, and the source voltage of transistor M1 is equal to Vin, the gate-to-source voltage Vgs of transistor M1 is equal to V++−V−−. This constant Vgs results in a relatively constant "on" resistance Ron of transistor M1, regardless of the instantaneous value of the input voltage Vin. Because the gate drive voltage is boosted by the input voltage during Interval 2, the "on" resistance is maintained relatively constant even if the input voltage Vin changes significantly between the end of Interval 1 and the end of Interval 2.

Additionally, since the transistor M1 is fully turned "on" by a constant Vgs that is much larger than the threshold voltage Vt of the transistor, its parasitic capacitances vary by only a small, weakly nonlinear amount as the input signal Vin varies over a wide range (from as low as the negative supply voltage V−− to as high as the positive supply voltage V++). This is in contrast to a transmission gate, whose dominant parasitic capacitances change abruptly and in a very nonlinear fashion as the signal voltage Vin varies over a wide range, as described above. The parasitic capacitance of transistor M1 interacts with both the finite impedance of the circuit providing input signal voltage Vin and the "on" resistance Ron of transistor M1. Because the parasitic capacitance of transistor M1 remains approximately constant, this interaction does not result in distortion of the input signal voltage Vin.

Moreover, because the Vgs of transistor M1 is maintained at V++−V−− during Interval 2, the gate-to-source breakdown voltage of transistor M1 is never exceeded. Thus, a constant "on" resistance, a nearly constant parasitic capacitance, and device stress protection is provided for a very wide range of input voltages and frequencies.

In a similar manner, because the gate drive voltage of transistor S4, provided during Interval 2 to by S4 drive circuit 40, is equal to the input voltage Vin, and the source voltage of transistor S4 is equal to Vin+V++−V−−, the source-to-gate voltage Vsg of transistor S4 is equal to V++−V−−, which is constant and independent of the instantaneous signal voltage Vin. For reasons cited above, during Interval 2, transistor S4 has a linear "on" resistance and its parasitic capacitances are nearly constant as well. Since transistor S4 is coupled to the input during Interval 2 (through capacitor $C_{BOOT}$ and transistor S3), the parasitic capacitance of transistor S4 interacts with the finite impedance of the circuit providing input signal voltage Vin. Because the parasitic capacitance of transistor S4 remains approximately constant, this interaction does not result in distortion of the input signal voltage Vin.

Moreover, because the Vsg of transistor S4 is maintained at V++−V−− during Interval 2, the gate-to-source breakdown voltage of transistor S4 is never exceeded.

In a similar manner, because the gate drive voltage of transistors S3 and S7, provided during Interval 2, is equal to Vin+V++−V−−, and the source voltage of transistors S3 and S7 is equal to Vin, the gate-to-source voltage Vgs of transistors S3 and S7 is equal to V++−V−−, which is constant and independent of the instantaneous value of the signal voltage Vin. For reasons cited above, transistors S3 and S7 each has a linear "on" resistance during Interval 2, and each has a parasitic capacitance that is nearly constant as well. Since both transistors S3 and S7 are coupled to the input during Interval 2 (S3 directly, and S7 through S3), the parasitic capacitance of transistor S3 and transistor S7 interacts with the finite impedance of the circuit providing input signal voltage Vin. Because the parasitic capacitance of transistors S3 and S7 remains approximately constant, this interaction does not result in distortion of the input signal voltage Vin.

Moreover, because the Vgs of transistors S3 and S7 is maintained at V++−V−− during Interval 2, the gate-to-source breakdown voltage of neither transistor is ever exceeded In addition, the capacitors used are double-polysilicon capacitors which avoid non-linear parasitics, which may introduce distortion.

While the input voltage provided to transistor S3 is shown as a direct input in FIG. 7, it should be appreciated that a buffered version of the input voltage Vin alternatively could be provided, as in the embodiment shown in FIG. 6.

Figure 8:
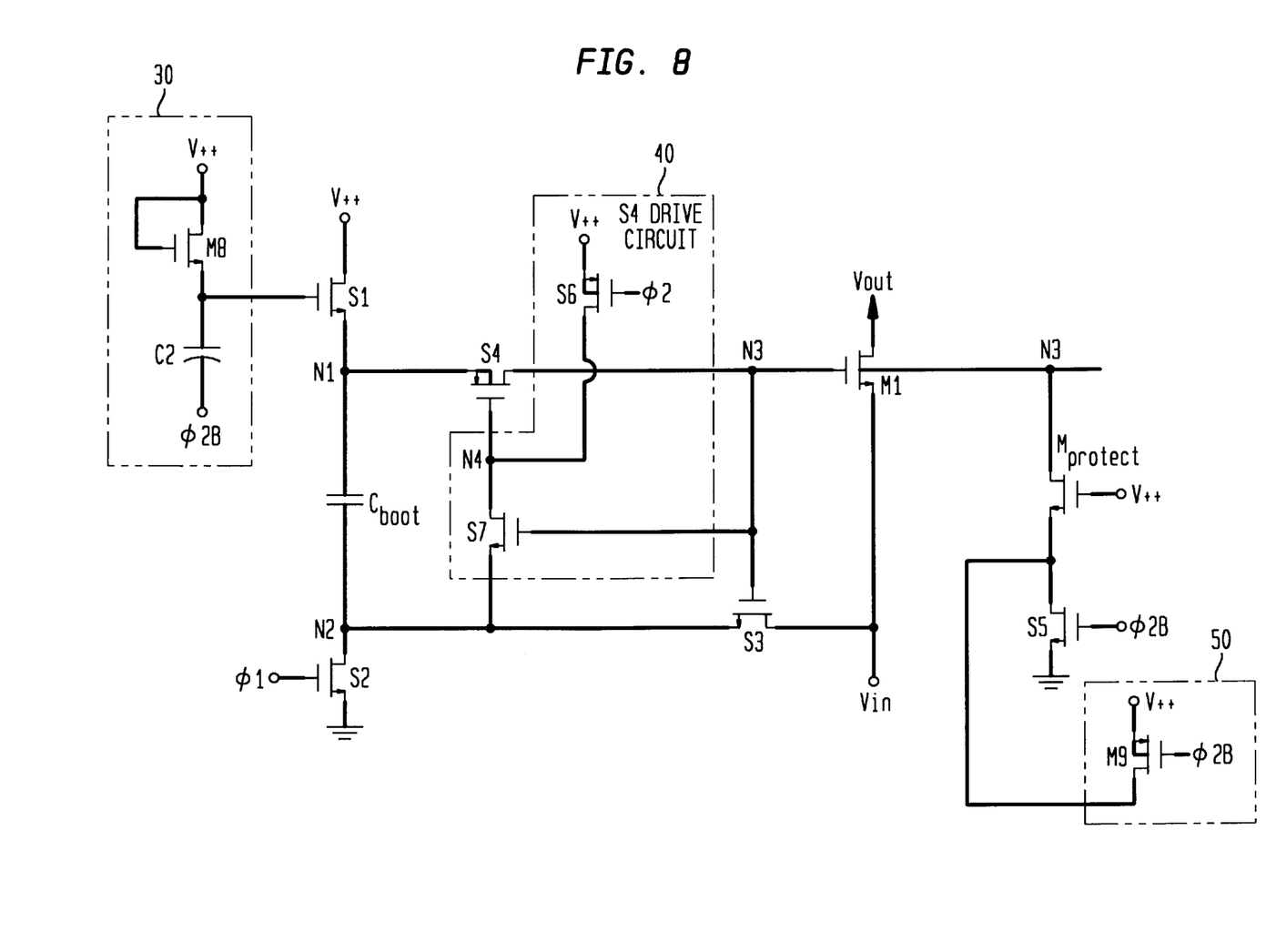
FIG. 8 is a more detailed schematic diagram of a particular implementation of the embodiment of the invention shown in FIG. 7.

FIG. 8 is a more detailed schematic diagram of a particular implementation of the embodiment shown in FIG. 7. The embodiment of FIG. 8 includes S1 drive circuit 30 consisting of an NMOS transistor M8 and a capacitor C2. Also shown is a specific implementation of start up circuit 50 including a PMOS transistor M9 controlled by signal Φ2B and receiving the positive supply voltage V++ at its source. The drain of transistor M9 is connected to the source of the protection transistor $M_{protection}$. Transistor M9 along with the protection transistor $M_{protection}$ acts to function as the start up circuit for transistors M1, S3 and S7, as described with respect to FIG. 7.

Figure 9:
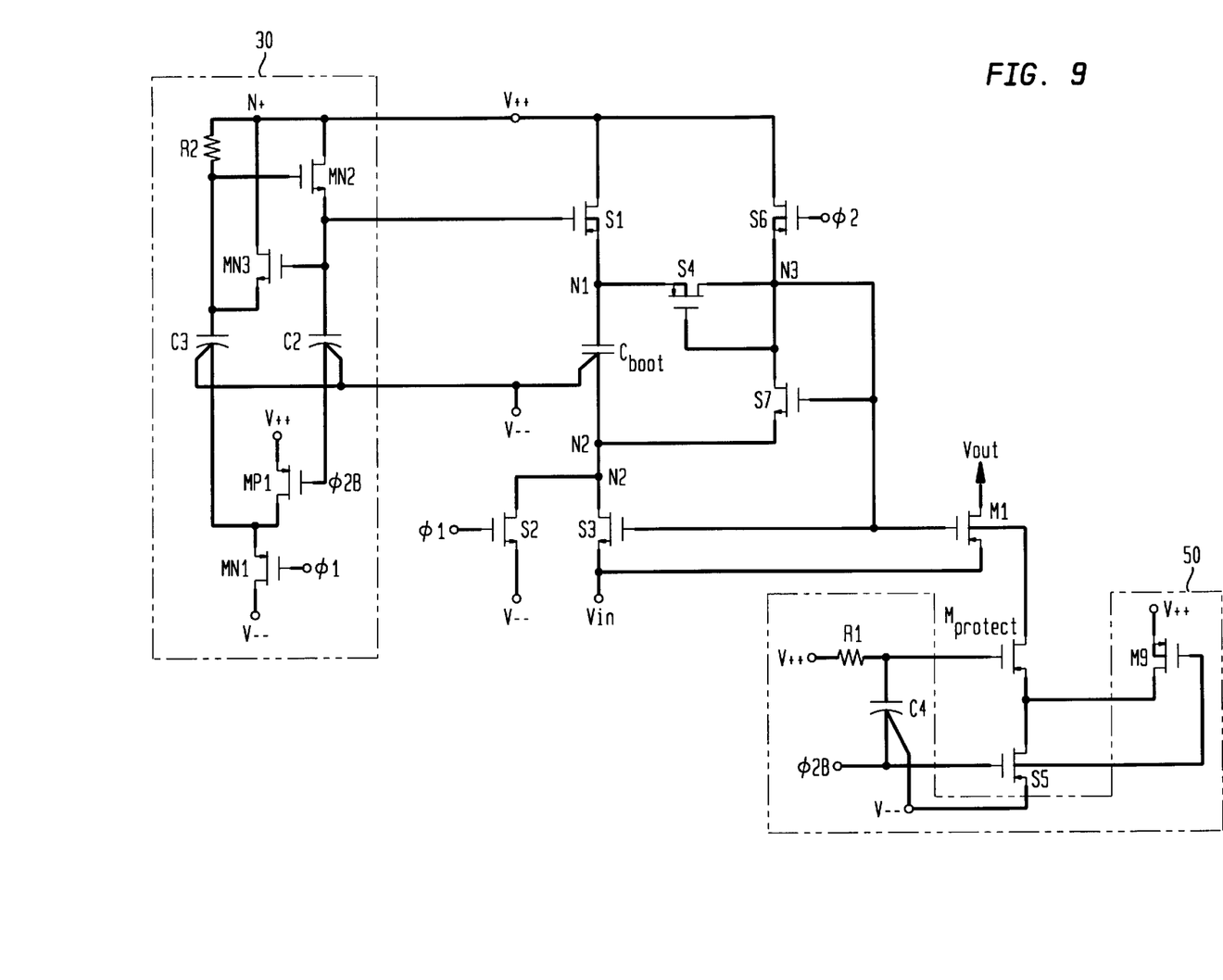
FIG. 9 is an even more detailed schematic diagram of a particular implementation of the embodiment of the invention shown in FIG. 7.

FIG. 9 is a more detailed schematic diagram of a the embodiment of the invention shown in FIG. 7. The embodiment of FIG. 9 includes S1 drive circuit 30 consisting of transistors MN1, MN2, MN3, and MP1, capacitors, C2 and C3, and resistor R2. The circuit operates to provide a boosted signal to the gate of transistor switch S1 when Φ2B goes high in order to turn "on" transistor S1 at time t1 as shown in FIG. 2, and to bring the gate of transistor switch S1 to V++ in order to turn "off" transistor S1 when Φ2B goes low at time t4 as shown in FIG. 2.

Also shown is a specific implementation of startup circuit 50 including a PMOS transistor M9, controlled by signal Φ2B, and receiving the positive supply voltage V++ at its source. The drain of transistor M9 is connected to the source of the protection transistor $M_{protection}$. Transistor M9 along with the protection transistor $M_{protection}$ acts to function as the start up circuit for transistors M1, S3 and S7, as described with respect to FIG. 7. Also included in startup circuit 50 is capacitor C4 and resistor R1. The purpose of these two elements is to prevent the drain-to-source voltage Vds across transistor $M_{protection}$ from exceeding a maximum stress level, equal to the supply voltage V++−V−−, at time t1 (i.e., at the end of Interval 2), as shown on FIG. 2.

In each of the embodiments described above, stress protection is provided for each and every device in the circuit. For each device in each of the embodiments, none of the drain-to-source voltage Vds, the gate-to-source voltage Vgs, or the gate-to-drain voltage Vgd will be greater than the noted maximum supply voltage for a particular process chosen.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. the invention is limited only as defined in the following claims and the equivalents thereto.

What is claimed is:

1. A circuit that produces a control voltage for a transistor switch that receives an input voltage on a source terminal, the circuit comprising:
   a first input that receives the input voltage;
   a second input that receives a bias voltage;
   a voltage storage element;
   a first switch that connects the voltage storage element to sample the bias voltage during a first of first and second time internals;
   a second switch that connects the voltage storage element to increase the sampled voltage by the input voltage to the control voltage during the second time interval, while maintaining the control voltage less than a breakdown voltage of the transistor switch; and
   a third switch that connects the voltage storage element to provide the control voltage to the transistor switch during the second time interval.

2. The circuit claimed in claim 1 wherein the voltage storage element includes a capacitor.

3. The circuit claimed in claim 1 wherein the transistor switch includes a MOS transistor.

4. The circuit claimed in claim 3 wherein the control voltage drives a gate of the MOS transistor.

5. The circuit claimed in claim 3 wherein a gate-to-source voltage of the MOS transistor is maintained approximately constant during the second time interval.

6. The circuit claimed in claim 1 wherein the first and second time intervals are non-overlapping.

7. A method for producing a control voltage for a transistor switch that receives an input voltage on a terminal, the method comprising the steps of:
- sampling a bias voltage onto a voltage storage element during a first of first and second time intervals;
- increasing the sampled voltage by the input voltage to the control voltage during the second time interval, while maintaining the control voltage less than a breakdown voltage of the transistor switch; and
- providing the control voltage to the transistor switch during the second time interval.

8. The method claimed in claim 7 wherein the transistor switch includes a MOS transistor.

9. The method claimed in claim 8 wherein the control voltage drives a gate of the MOS transistor.

10. The method claimed in claim 7 wherein the first and second time intervals are non-overlapping.

11. The method claimed in claim 8 wherein a gate-to-source voltage of the MOS transistor is maintained approximately constant during the second time interval.

* * * * *